(12) United States Patent
McBride et al.

(10) Patent No.: US 7,955,551 B2
(45) Date of Patent: Jun. 7, 2011

(54) ALKALI METAL DISPENSER AND USES FOR SAME

(75) Inventors: Sterling Eduardo McBride, Princeton, NJ (US); Steven Alan Lipp, West Windsor, NJ (US); Joey John Michalchuk, Lambertville, NJ (US); Dana Z. Anderson, Boulder, CO (US); William Frederick Holmgren, Tucson, AZ (US); Matthew B. Squires, Tewksbury, MA (US)

(73) Assignees: SRI International, Menlo Park, CA (US); The Regents of University of Colorado, a body Corporate, Boulder, CO (US)

( * ) Notice: Subject to any disclaimer, the term of this patent is extended or adjusted under 35 U.S.C. 154(b) by 202 days.

(21) Appl. No.: 12/121,068

(22) Filed: May 15, 2008

(65) Prior Publication Data

US 2009/0013826 A1    Jan. 15, 2009

Related U.S. Application Data

(60) Provisional application No. 60/938,085, filed on May 15, 2007.

(51) Int. Cl.
*C22B 7/00* (2006.01)

(52) U.S. Cl. .......... 266/200; 266/202; 420/400
(58) Field of Classification Search .......... 75/590; 420/400, 590; 266/202, 200
See application file for complete search history.

(56) References Cited

U.S. PATENT DOCUMENTS

| | | | |
|---|---|---|---|
| 2,480,655 A * | 8/1949 | Jackson et al. | 420/400 |
| 4,049,443 A * | 9/1977 | Hatterer et al. | 420/590 |
| 4,233,936 A | 11/1980 | Longsderff et al. | |
| 5,532,102 A * | 7/1996 | Soden et al. | 430/128 |
| 6,010,750 A * | 1/2000 | Gole et al. | 427/250 |
| 6,235,615 B1 * | 5/2001 | Dinh et al. | 438/487 |
| 2006/0257296 A1 * | 11/2006 | Lipp | 422/159 |

OTHER PUBLICATIONS

International Search Report for PCT/US2008/63706 (Jan. 12, 2009).
Bulletin of Allow Phase Diagrams (1986) 7:2, 140-41.

* cited by examiner

*Primary Examiner* — George Wyszomierski
*Assistant Examiner* — Tima M McGuthry-Banks
(74) *Attorney, Agent, or Firm* — Lowenstein Sandler PC

(57) ABSTRACT

The present invention provides an improved alkali metal dispenser which is pure and free of contaminant gases, and provides for controlled releasing, delivery and recycling of the alkali metal in multiple stages in a controlled manner. The present invention also provides an alkali metal pump or getter.

39 Claims, 7 Drawing Sheets

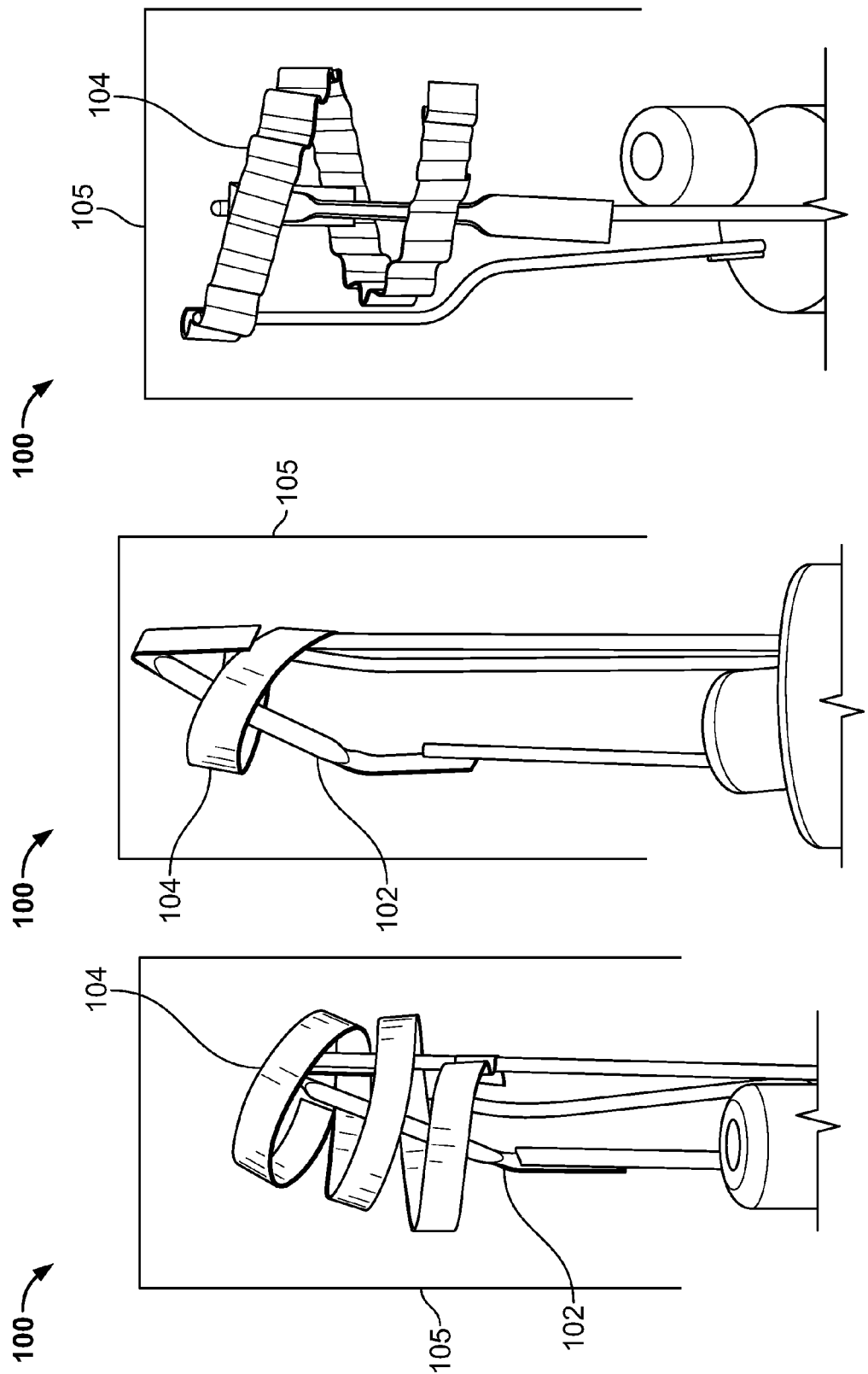

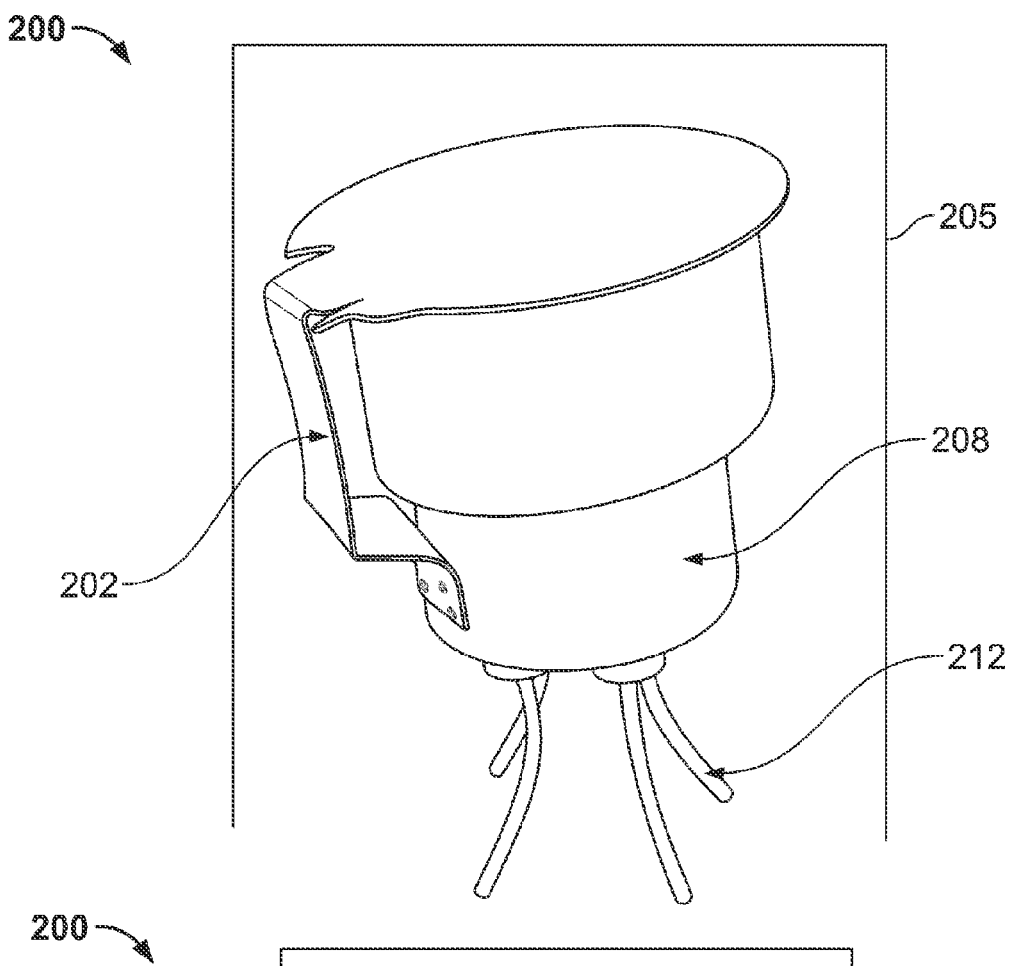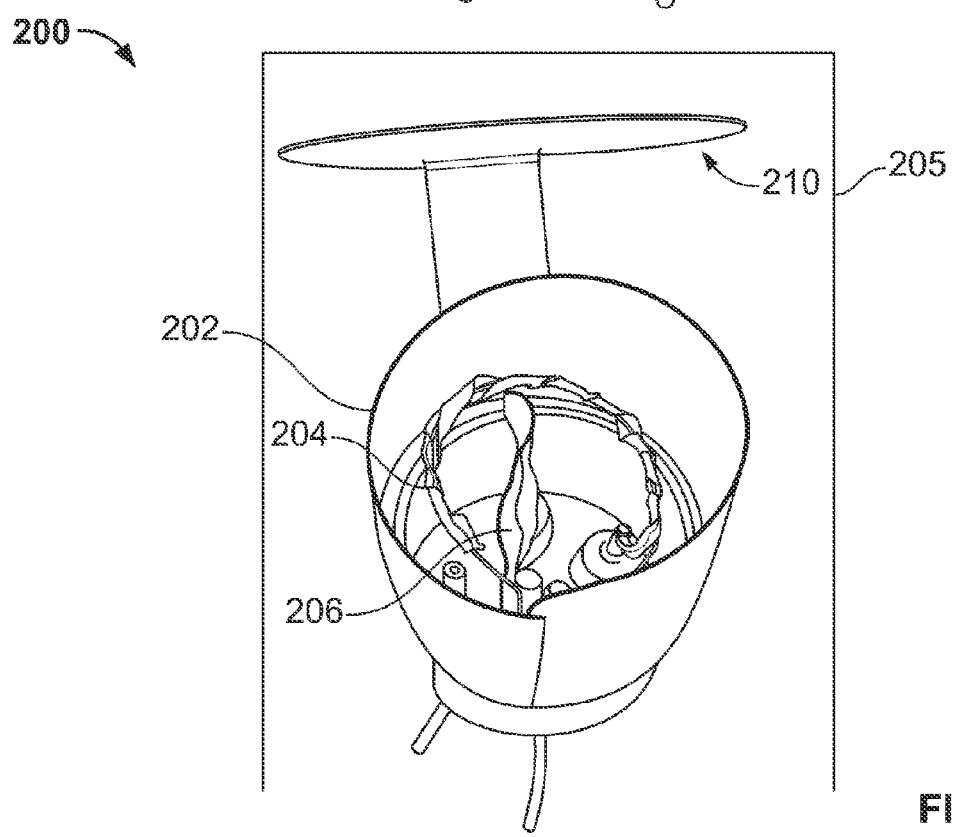
FIG. 2A

ALKALI METAL DISPENSER AND USES FOR SAME

CROSS-REFERENCE TO RELATED APPLICATION

This application claims priority benefit of U.S. Provisional Application Ser. No. 60/938,085 filed May 15, 2007, which is hereby incorporated by reference in its entirety.

GOVERNMENT RIGHTS IN THIS INVENTION

This invention was made with U.S. government support under contract number W911NF-04-1-0043. The U.S. government has certain rights in this invention.

FIELD OF INVENTION

The present invention relates to alkali metal dispensers and more particularly, an improved alkali metal dispenser composition and a system, which is pure and excluded from contaminant gases and provides for dispensing of an alkali metal. The present invention further relates to an alkali metal getter or pump and a method for gettering and pumping the alkali metal.

BACKGROUND OF THE INVENTION

Advancements in atomic physics over the past two decades have allowed scientists exquisite control over the external quantum states of atoms, including the deliberate production of matter waves from ultra-cold atoms. This has allowed the development of matter wave interferometry techniques to measure forces acting on matter including high-precision atomic accelerometers and gyroscopes. Technology seeks to use ultra-cold atom systems such as interferometers for Inertial Navigation Systems (INS) as one of the alternatives to GPS position updates.

In ultra-cold atom systems, such as Bose-Einstein Condensate cooling systems, one important component is the alkali metal dispenser. Current state of the art alkali metals dispensers are commercial dispensers and dispensers as described in US Patent Publication No. 20060257296. These dispensers are single-stage dispensers consisting of an alkali metal/Au pellet with a heater. The single-stage dispenser is fabricated by forming a mixture of $Rb_2CO_3$ or Rb and gold, which is then pressed into the form of a pellet. The pellet is attached to a NiChrome heater. In the area of Rb dispensers, US Patent Publication No. 20060257296 also discloses developing isotopically enhanced Rb(87) dispensers consisting of a Rb/Au pellet with isotopically enhanced Rubidium Carbonate.

The current state of the art alkali metal dispensers are impure and produce large amounts of contaminant gases during their operation. There is a need in the art for developing an improved alkali metal dispenser free of these contaminant gases. There is also a need in the art for developing an improved alkali metal dispenser for controlled and precise delivery of the alkali metal. There is further a need in the art to recycle the alkali metal.

BRIEF DESCRIPTION OF THE DRAWINGS

The present invention will be more readily understood from the detailed description of exemplary embodiments presented below considered in conjunction with the attached drawings, of which:

FIGS. 1a, 1b and 1c illustrate a dual-stage metal dispenser device in according to different embodiment of the present invention.

FIG. 2a illustrates a dual-stage metal dispenser device in accordance with an alternate embodiment of the present invention.

SUMMARY OF THE INVENTION

Figure 2B:
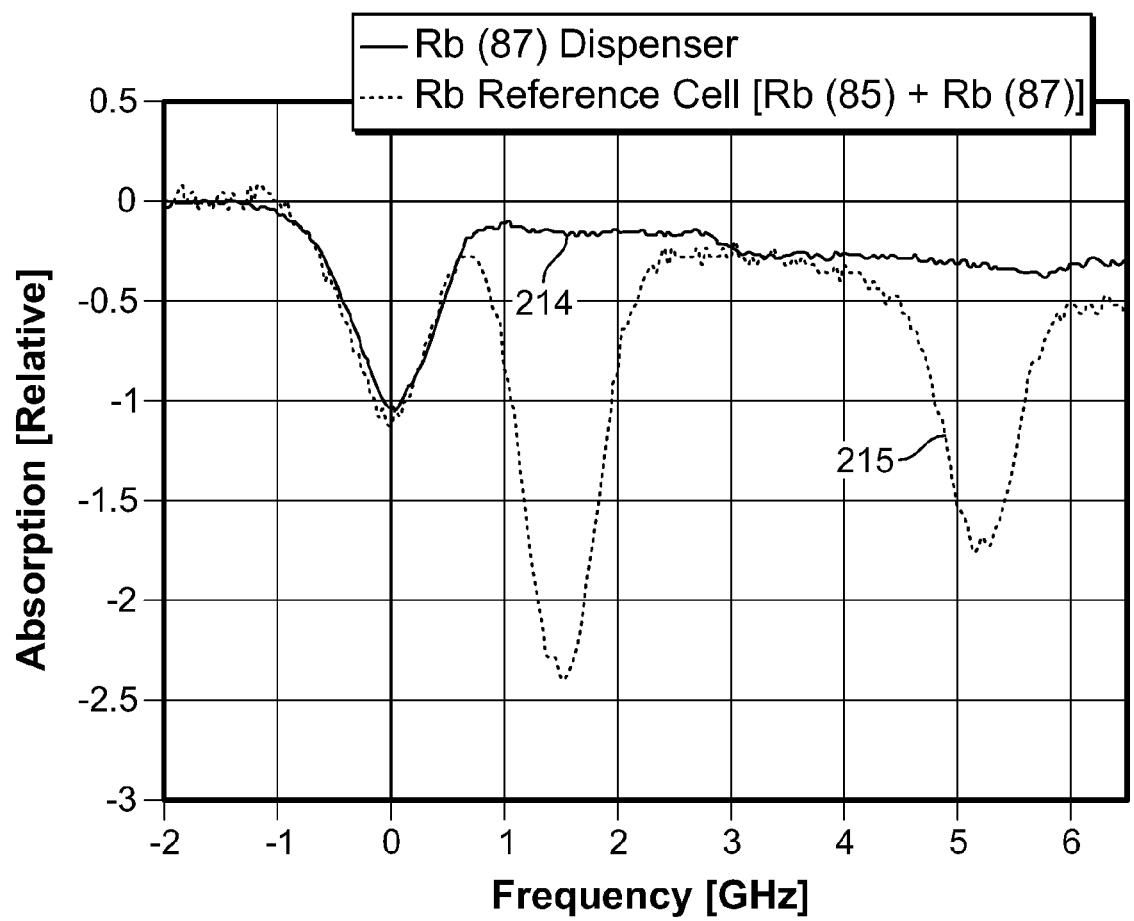
FIG. 2b illustrates a graphical representation of absorption spectra of the Rb dispenser.

In one embodiment the present invention, there is provided a dispenser device in a vacuum and method for generating the same. The dispenser device comprising at least one alkali metal source and at least one receptor.

In another embodiment of the present invention, there is provided dispenser device in a vacuum and method for generating the same. The dispenser device comprising at least one receptor, at least one alkali metal source and at least one metal evaporator.

In further embodiment of the present invention, there is provided an alkali metal pump device in a vacuum and method for generating the same. The alkali metal pump device comprising at least one metal evaporator comprising metal such that the metal is evaporated in the vacuum to form an alloy with an alkali metal.

In even further embodiment of the present invention, there is provided a device in a vacuum and method for generating the same. The device comprising at least one multi-stage dispenser comprising at least one alkali metal source, at least one receptor and at least one first metal evaporator. The first metal evaporator comprising a metal. The device also comprising at least one alkali metal pump positioned below the at least one multi-stage dispenser. The pump comprising at least one second metal evaporator comprising the metal.

DETAILED DESCRIPTION OF THE INVENTION

Definitions. In describing the present invention, the following terms and phrases will be used with the intent to be defined as indicated immediately below. Definitions for other terms and phrases can occur throughout the specification. It is intended that all terms and phrases used in the specification include the plural, active tense and past tense forms of a term or a phrase.

As used herein, the phrase "alkali metal" refers to an element in Group 1 (International Union of Pure and Applied Chemistry (IUPAC)) of the periodic table of the chemical elements, and includes, e.g., cesium (Cs), francium (Fr), lithium (Li), potassium (K), rubidium (Rb) and sodium (Na).

The phrase, "alkaline earth metal," as used herein, refers to an element of Group 2 (IUPAC) of the periodic table of the chemical elements, and includes, e.g., barium (Ba), beryllium (Be), calcium (Ca), magnesium (Mg) and strontium (Sr).

The term "alloy," as used herein, refers to a mixture of two or more metals or of one or more metals with certain metalloids (meaning nonmetallic elements, such as arsenic and selenium, with some of the chemical properties of metals) that are mutually soluble in the molten condition; distinguished as binary, ternary, quaternary, etc., depending on the number of metals in the mixture.

The phrase "controlled environment," as used herein, refers to an area whose atmosphere is maintained under a vacuum (defined herein) or so as to be inert (defined herein).

The phrase "getter for alkali metals" refers to a substance that lowers the amount of the free, unbound alkali metal atoms available, e.g., by binding or interacting with the alkali metal atoms. Often a getter for alkali metals is a "metal," i.e., a substance having overlapping conductance bands and valence bands in its electronic structure.

As used herein, the term "heating" and the phrase "heating element" refer to a means for providing heat; and includes, without limitation, (1) "resistive heating" meaning a process whereby the temperature of a material increases due to its ability to convert electricity into heat as a result of resistance to the electrical current flowing through it; such a material is often referred to as a "conductor" (meaning a material that contains movable charges of electricity); (2) "induction heating," which refers to a process that relies on induced electrical currents within a material to raise the temperature of the material and thus, produce heat. Induction heating uses an alternating current (AC) power supply, induction coil and a material to be heated (often referred to as a "workpiece"). When the workpiece is placed in the coil, the AC power supply sends alternating current through the coil, thereby, generating an electromagnetic field, which induces eddy currents in the workpiece, thus, raising the temperature of the workpiece by subjecting it to the alternating electromagnetic field without any physical contact between the coil and the workpiece. And includes (3) "lasers" (Light Amplification by Stimulated Emission of Radiation) meaning sources of light that can be concentrated to produce a small spot of intense heat energy.

The term, "nichrome," as used herein, refers to an alloy of nickel and chromium, which has a high electrical resistance and an ability to withstand high temperatures.

The term "tungsten," as used herein refers to a chemical element, which can be used as a heater and has the ability to withstand high temperatures.

The term, "inert," as used herein, means having a limited ability, or lacking the ability, to react chemically.

As used herein, the term "mixture" refers to a sample of matter having more than one pure element or compound in association where the elements or compounds retain their properties within the sample. A mixture can be homogeneous (meaning uniform or identical throughout) or heterogeneous (meaning dissimilar or non-uniform throughout).

The term, "vacuum," as used herein, means under pressure below atmospheric pressure.

The term "receptor," as used herein refers to a component that has the ability to capture a chemical compound.

Referring to FIG. 1, there is illustrated a dual-stage metal dispenser device 100 according to different embodiments of the present invention. As shown in FIG. 1, the dispenser device 100 consists of alkali metal source, 102, for example, a pellet dispenser or a commercial dispenser. Such commercial dispensers are sold by SAES Getters, USA, Inc. Colorado Springs, Colo. The alkali metal source 102 may preferably consists of one of the alkali metals, or alkali metal compounds. The alkali metal source 102 may preferably consists of one of the alkaline earth metals or alkaline earth metal compounds. The dispenser device 100 further consists of a receptor 104, as shown in FIG. 1. The receptor 104 preferably is a nichrome or a tungsten foil, which can be coated with metal, for example, gold, prior to being assembled with the alkali metal dispenser 102. Note that the alkali metal source 102 and the receptor 104 are not physically connected to one another; however, they may share a wiring/ground or a base that holds them together. The embodiment of the device 100 operates in a vacuum chamber 105. Gold is an effective getter material for removing or dispensing alkali metal such as Rubidium vapor in the vacuum chamber 105 as will be described in detail below.

FIGS. 1a, 1b and 1c show different embodiments with different shape receptors 104, having different surface areas. Increase in the surface area is accomplished preferably by wrapping around multiple turns and/or corrugating the receptor foil. Increase in the surface area of the receptor 104 means increasing the capacity of holding more alkali metal.

In the dual-stage dispenser device 100 of this embodiment, the alkali metal dispensing is accomplished in two stages. In the first stage, the alkali metal, for example, Rb is released from the alkali metal dispenser 102, preferably by heating the alkali metal dispenser 102 in-situ in FIG. 1. When the Rb is released, it deposits itself on the surface of the receptor 104 to form an alloy with the gold as shown in FIG. 1. The alloying of Rb with gold is described in *Bulletin of Alloy Phase Diagrams*, Vol. 7, No. 2, pg 140. Also, some of the Rb will be adsorbed by the surface of the receptor 104. However, the amount of Rb adsorbed is negligible compared to the Rb alloyed with gold. In the second stage, the Rb is released from the receptor 104 by heating the receptor 104 in-situ at the desorption and alloy decomposition temperatures. This alloy decomposition temperature for Rb is preferably around 500 degrees centigrade, example at 496 degrees. However, this alloy decomposition temperature will differ for the other alkali metals. Heating is accomplished preferably by passing a current through the nichrome or tungsten foil of the receptor 104. The current can be constant (DC voltage) or pulsed.

Besides Rb, other gases such as carbon and oxygen will also be released into the system upon heating of the alkali metal dispenser 10. Such gases are contaminants that can be removed from the system by vacuum pumping or using gas getters. such as non-evaporative getters from SEAS (SEAS Getters USA, Inc.). A small fraction of the contaminant gases will be weakly adsorbed on the surface of the receptor 104. These gases are easily removed from the surface of the receptor 104 by slightly heating the receptor 104 at temperatures much below the alkali metal alloy decomposition temperature, preferably in the range of 100 degrees centigrade.

In another embodiment of the present invention, in the dual-stage dispenser device 100, the alkali metal dispensing is accomplished in two stages. In the first stage, the alkali metal, for example, Rb is released from the alkali metal dispenser 102, preferably by heating the alkali metal dispenser 102 in FIG. 1 in-situ, which is very similar to the first stage described above. When the Rb is released, it is deposited on the surface of the receptor 104, which is kept at a temperature below the alkali metal alloy decomposition temperature forming an alloy with the gold as shown in FIG. 1. By heating the receptor in-situ during deposition, the adsorption of chemical species such as the contaminant gases are drastically reduced and in many cases completely eliminated. Similarly, the alkali metal that is weakly adsorbed into the surface and that has not alloyed with the gold will be reduced or eliminated. In this embodiment, the receptor 164 is heated at about 100 degrees prior to the release of the Rb, so when the Rb is released and deposited onto the receptor 104, it is already warm and is capable of inhibiting adsorption of the contaminant gases and also some of the alkali metal Referring to FIG. 2a, there is illustrated a dual-stage metal dispenser device 200 according to another embodiment of the present invention. As shown in FIG. 2a, the dispenser 200 consists of an alkali metal source 206, for example, a pellet dispenser or a SAES commercial dispenser, similar to the alkali metal source 102 in FIG. 1. The dispenser device 200 also consists of a receptor 202, which preferably is a nichrome or a tungsten foil and is typically about 0.5 mils thick. The receptor 202 includes a lid 210. The dispenser device 200 further includes an evaporation coil 204 as illustrated in FIG. 2. The evaporation coil 204 is preferably a tungsten wire with a metal foil or wire, for example, a gold foil or gold wire wrapped around it. The device is supported by a base 208 with electrical connections 212. The alkali metal source 206, the receptor 202, and the evaporation coil 204 of the dispenser 200 are attached to electrical connections or post 212 in the base 208, which provide mechanical support and a way to apply an electrical current to the dispenser components. Note that the alkali metal source 206, the receptor 202 and the evaporation coil 204 are not physically connected to one another; however, they may share a wiring/ground or a base that holds them together.

Although not shown, in another embodiment the receptor 202 also includes a semiconductor membrane or bridge, which is supported between the connections 212. The semiconductor membrane or bridge is preferably silicon and can be fabricated by well know semiconductor fabrication processes such as lithography and etching. The embodiment of the device 200 operates in a vacuum chamber 205.

In this embodiment, the dual-stage dispenser device 200 is prepared by first evaporating gold into receptor 202 in the vacuum 205. Gold is evaporated in-situ from the evaporation coil 204 into the receptor 202 with lid 210 closed to prevent evaporation outside the receptor 202 formed enclosure. In this way, the receptor 202 is now coated with gold, thus retaining the gold evaporation inside the dispenser device 200. By evaporating the gold in situ prevents the possibility of other contaminants and provides for better efficiencies of capturing the alkali metal, for example Rb.

The alkali metal dispensing of the dispenser device 200 is now accomplished in two stages similar to the embodiment described above. In the first stage, the alkali metal, for example, Rb is released from the alkali metal dispenser 206, preferably by heating the alkali metal dispenser 206. When the Rb is released it deposits itself on the surface of the receptor 202 to form an alloy with the gold. Also, a very negligible amount of the Rb will be adsorbed by the surface of the receptor 202 in addition to the adsorption of the Rb by alloying. In the second stage, the Rb is released from the receptor 202 by heating the receptor 202 above desorption and alloy decomposition temperatures. This alloy decomposition temperature for Rb is preferably around 500 degrees centigrade, example at 496 degrees centigrade. However, this alloy decomposition temperature will differ for the other alkali metals. As mentioned above, heating is accomplished preferably by passing a current through the nichrome or tungsten foil of the receptor 202.

Thus, the process described in the above embodiment provides for fabrication of multi-stage dispenser by alternate deposition of the alkali metal and the gold on the receptor 202. The goal is to trap the alkali metal atoms adsorbed and alloyed by the surface of the receptor 202 via the gold layer to attain a better control of the Rb release during dispenser operation.

In a preferred embodiment of the present invention, the alkali metal dispenser 206 is a $^{87}$Rb pellet. The $^{87}$Rb pellet produces a single isotope of Rubidium compared to commercial dispensers. This comparison is shown by the absorption spectra illustrated in FIG. 2b. As an example the commercial dispensers, such as SAES, dispense two isotopes of Rb, which is Rb(85) and Rb(87). A first curve 215 in FIG. 2b shows the absorption spectra of the commercial dispenser that releases Rb(85)+Rb(87), indicated by the multiple absorption peaks. A second curve 214 shows the absorption spectra of the single isotope Rb(87) dispenser indicated by a single peak for the scanning range shown in FIG. 2b. A single isotope dispenser is preferred since other isotopes will act as contaminants in the vacuum system for many important applications. The dispensing of the alkali metal in this preferred embodiment operates inside a vacuum chamber.

Figure 3:
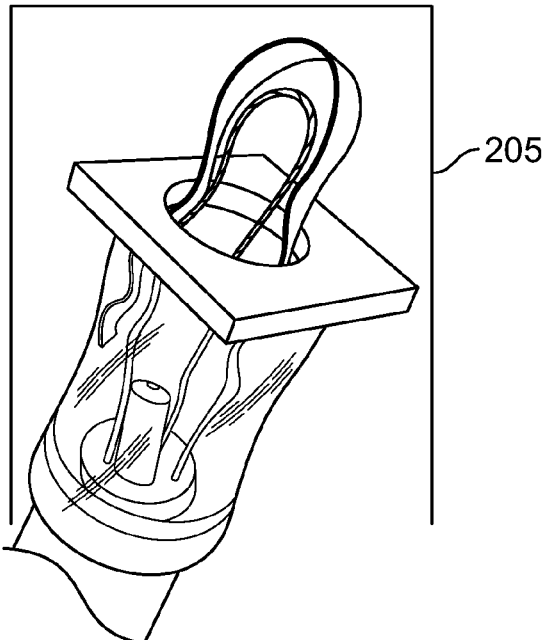
FIG. 3 illustrate an alkali metal pump or getter in accordance with an embodiment of the present invention.

In another embodiment of the present invention, the dispenser device 200 described above also functions as an alkali metal pump (a.k.a. getter) 300 for vacuum atom systems as illustrated in FIG. 3. The alkali metal pump 300 consists of the receptor 202 and the evaporation coil 204, both supported by the base 208. The pump 300 does not contain the alkali metal source 206 of FIG. 2a. The receptor 202 is preferably a nichrome or tungsten foil and is typically 0.5 mils thick. Although not shown, the receptor 202 can alternatively be an enclosure of walls of a vacuum chamber or can be a semiconductor membrane or bridge, preferably made of silicon. The evaporation coil 204 is preferably a tungsten wire with a metal foil or wire, for example, a gold foil or wire wrapped around it, as illustrated in FIG. 3. The embodiment of the device 300 operates in a vacuum chamber 205.

In the embodiment of FIG. 3, the pumping (a.k.a. gettering) action is attained first by evaporating the gold in-situ from the evaporation coil 204. Thus, the evaporated gold from coil 204 alloys with the alkali metal, for example Rb, in the vacuum system, causing a reduction of the alkali metal partial vapor pressure, therefore providing a gettering or pumping action. The alloyed alkali metal and gold are deposited on the walls of the vacuum system 205 that are on line of sight from the evaporating coil 204. The alkali metal is adsorbed on all surfaces in the vacuum but it is alloyed where gold is present with higher efficiency. Part of the alkali metal is also preferably adsorbed and alloyed to the receptor 202 and the evaporation coil 204. The gold forms alloy with the alkali metal, therefore, providing the pumping and gettering mechanism everywhere in the vacuum 205. Thus any alkali metal that is released into the vacuum after gold evaporation will form an alloy with gold on any surface that is coated with gold, providing a continuous gettering or pumping action.

It is noted that the receptor 202 in FIG. 3 is not required for pumping and gettering action. However, it is needed for recycling of the Rb. The pump 300 can be recycled by heating the receptor 202 until all the Rb is released and re-used somewhere else in the vacuum, perhaps on another receptor (not shown) located elsewhere in the vacuum system 205. Alternatively, the pump 300 can be recycled preferably by re-evaporating gold. This process of evaporating and re-evaporating gold to capture the alkali metal, and then re-releasing by heating may occur back and forth multiple times.

Figure 4A:
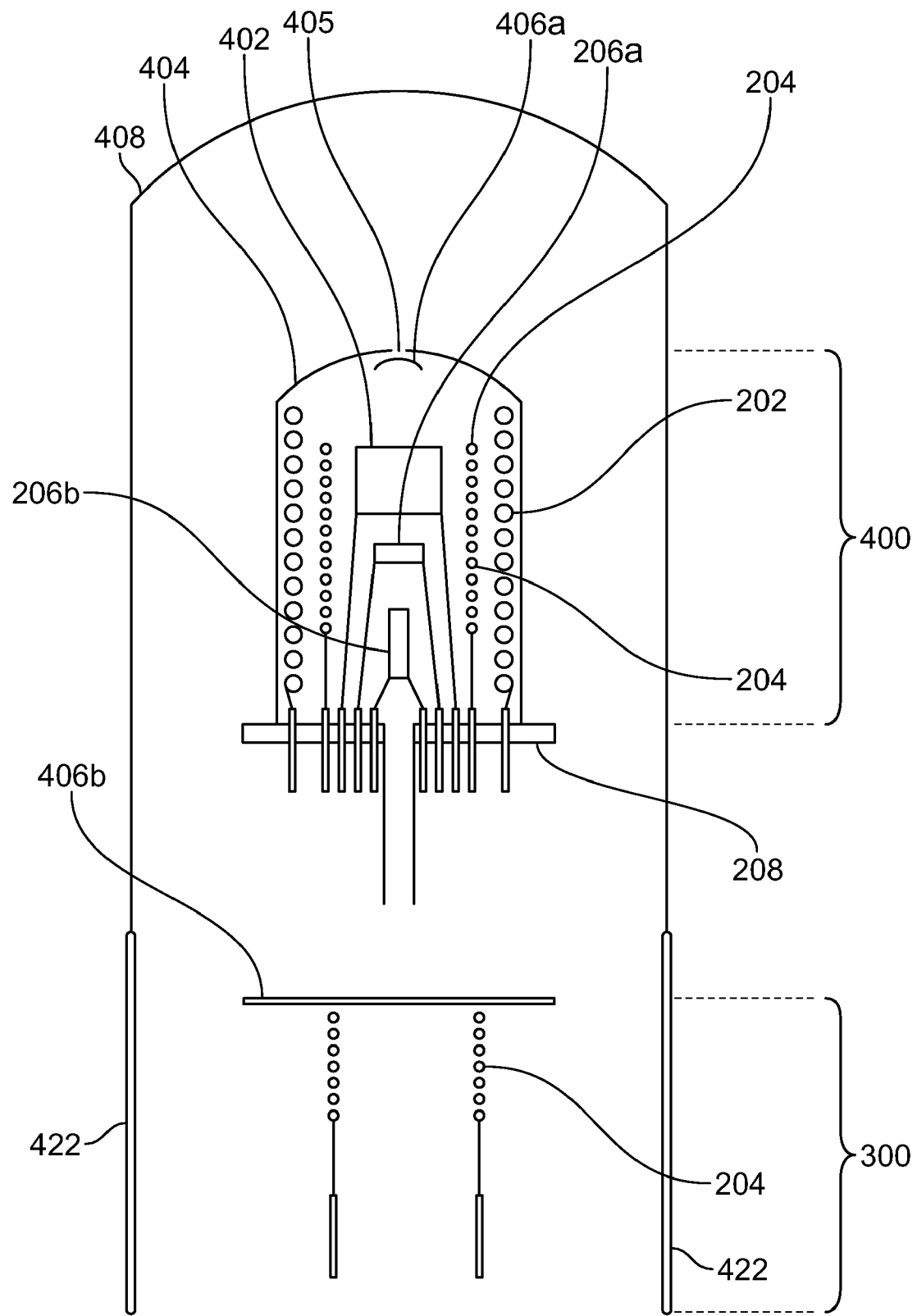
FIG. 4a illustrates a schematic diagram of an assembled dual-stage metal alkali dispenser device according in accordance with an embodiment of the present invention.
Figure 4B:
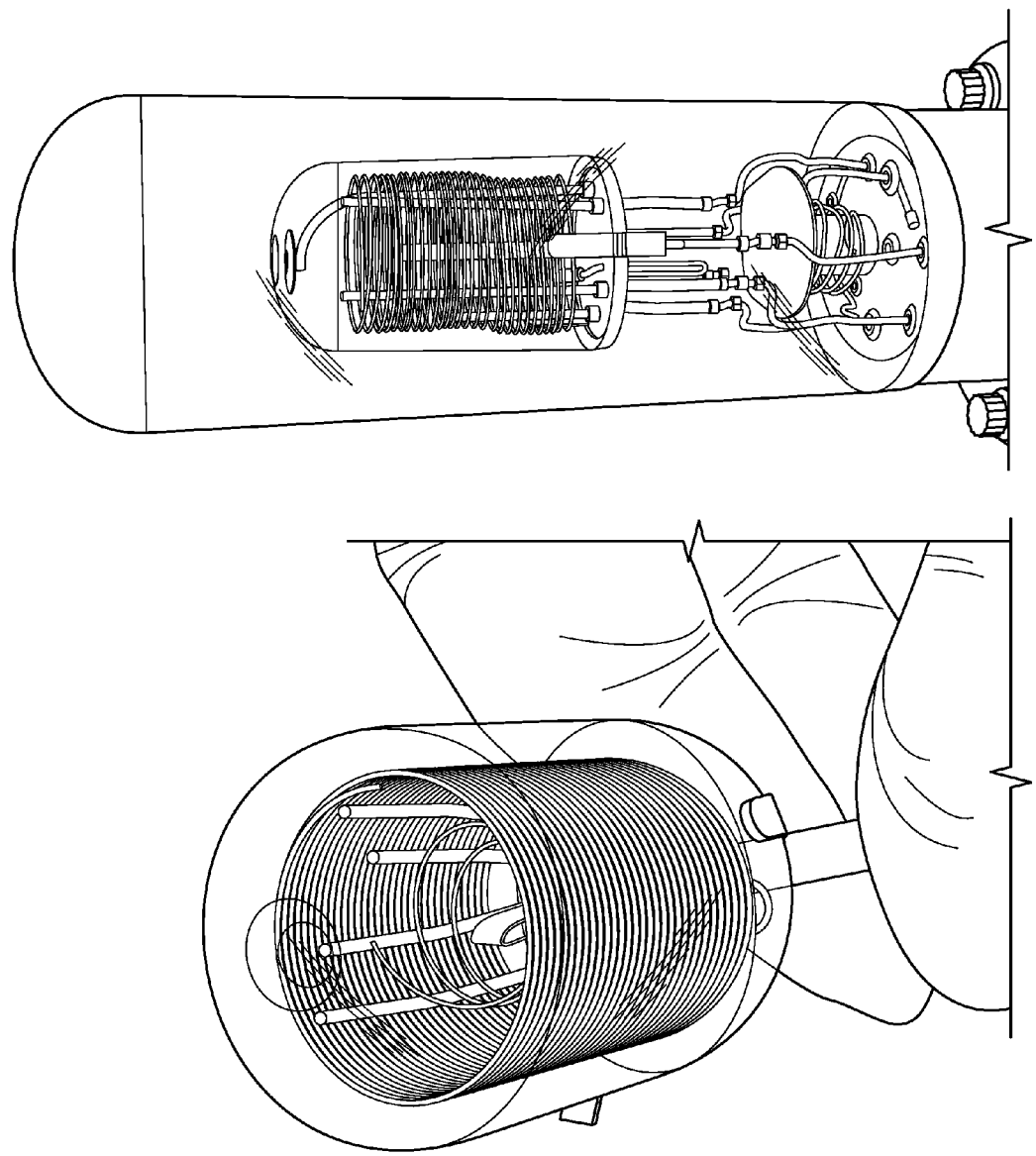
FIG. 4b illustrates a picture view of the assembled dual-stage metal alkali dispenser device of FIG. 4a FIG. 5 illustrates a graphical representation of the Rb Partial Pressure over a period of time.

Referring to FIG. 4a, there is illustrated a schematic diagram of an assembled dual-stage metal alkali dispenser device 400 according to another embodiment of the present invention. FIG. 4b illustrates a picture view of the assembled dual-stage metal alkali dispenser device 400 of FIG. 4a. As shown in FIG. 4a, the dispenser 400 consists of the alkali metal source 206 including a pellet dispenser 206a and/or a SEAS commercial dispenser 206b. Even though, the alkali metal source 206 in this embodiment includes both the pellet dispenser and the SAES dispenser, one skilled in the art would appreciate that the source 206 may preferably include only one dispenser and perform the same function. The dispenser device 400 also consists of the receptor 202 preferably made of a coiled wire or a nichrome or tungsten foil, as described above. The dispenser device 400 also consists of the evaporation coil 204 as shown in FIG. 4a. As mentioned above, the evaporation coil 204 is preferably a tungsten wire with a metal foil or wire, for example, a gold foil or gold wire wrapped around it. The dispenser device 400 further consists of a gas getter 402, which is a commercial device known in the art. The gas getter 402, when activated functions to absorb gases and minimizes the amount of gases from initial decomposition. Alternatively, the gas getter compound may be added in the mixture of composition of the alkali metal source 206 to eliminate the gases at the source.

The dispenser device 400 is supported on the base 208 as shown in FIG. 4a. The device 400 is placed in an enclosure 404, which includes an exit aperture 405 with a first baffle 406a surrounding the exit aperture 405. The first baffle 406 functions to prevent the evaporated gold from exiting outside the enclosure 404. The embodiment operates inside a vacuum chamber or enclosure 408. FIG. 4a also includes an alkali metal pump 300 positioned right underneath the dispenser device 400. The alkali metal pump 300 consists of an evaporation coil 204 and a second baffle 406b positioned right above the coil 204 as shown in FIG. 4a. Both the alkali metal dispenser device 400 and the alkali metal pump 300 functions to operate inside a vacuum chamber 408.

In this embodiment, the dual-stage dispenser device 400 is prepared by evaporating gold into receptor 202 in the vacuum 408, similar to the embodiment discussed above with reference to FIG. 2a. This causes other areas in the vacuum 408 in the line-of-sight from the evaporating coil 204 to be coated with gold. The alkali metal dispensing of the device 400 is now accomplished in two stages. In the first stage, the alkali metal, for example, Rb is dispensed from the pellet dispenser 206a and/or SAES commercial dispenser 206b. This causes the Rb to be deposited on the surface of the receptor 202 to form an alloy with the gold. Also, some of the Rb will be adsorbed on the surface of the receptor 202 and by the surrounding areas. In the second stage, the Rb is released by heating the receptor 202 at the alloy decomposition temperature. This alloy decomposition temperature for Rb is preferably around 500 degrees centigrade, example at 496 degrees centigrade. However, this alloy decomposition temperature will differ for the other alkali metals.

In the alkali metal pump 300, the evaporator coil 204 releases gold in-situ. This causes the gold to be deposited in every surface in line of sight from the evaporating coil 204. The gold is deposited in shaded areas 422, as shown in FIG. 4a. This shaded area 422 is also known as the Rb Pump area since it is the area where any Rb that is free moving inside the vacuum will preferably go to. Baffle 406b controls the direction of gold evaporation by preventing gold from spreading everywhere in the vacuum 408. In other words, the baffle 406b provides for most of the evaporated gold to remain in and around the alkali metal pump device 300. Alkali metal pumping is attained by alloying with exposed gold evaporated areas as described in the embodiment of FIG. 3 above.

Figure 5:
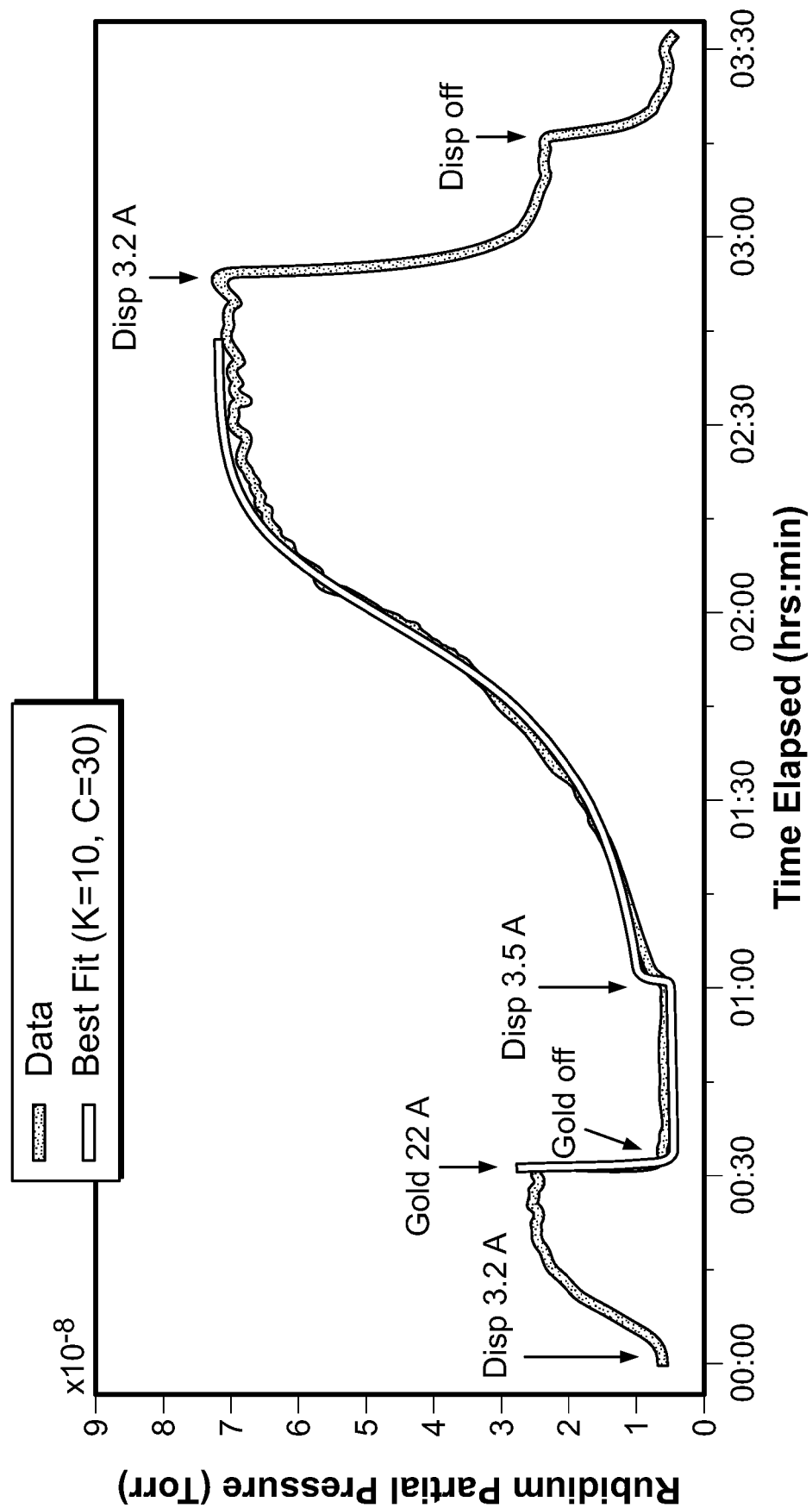

FIG. 5 illustrates a graphical plot of the Rb Partial Pressure vs. Time Elapsed with best fit curve. This graphical plot reveals the efficacy of the metal, gold operating as a rubidium getter or pump. As illustrated in FIG. 5, at the start of the record, Rb pressure is at a low background level. The rubidium (Rb) dispenser is heated with a current of preferably about 3.2 A, causing the Rb to reach a steady sate of $2.5 \times 10^{-8}$ Torr. Since there is no active pump, the fact that the pressure reaches steady state, the gold-coated tungsten wire is heated preferably at about 22 A current. The heat is sufficient to evaporate a portion of the gold off the wire and coat a section of the UHV cell walls. In response, the Rb pressure quickly falls to the background level even while the dispenser current is still on. The gold-coated tungsten is then switched off, but the dispenser remains on. After about 30 minutes of seeing no significant Rb signal, the dispenser current is increased to about 3.5 A. The partial pressure of Rb slowly increases as the gold pump becomes saturated. After reaching steady state at 3.5 A, the dispenser is turned back down to about 3.2 A so that the steady-state pressure can be compared to its earlier value with the dispenser at its initial of about 3.2 A. These pressures are the same to within measurement uncertainty.

Figure 6:
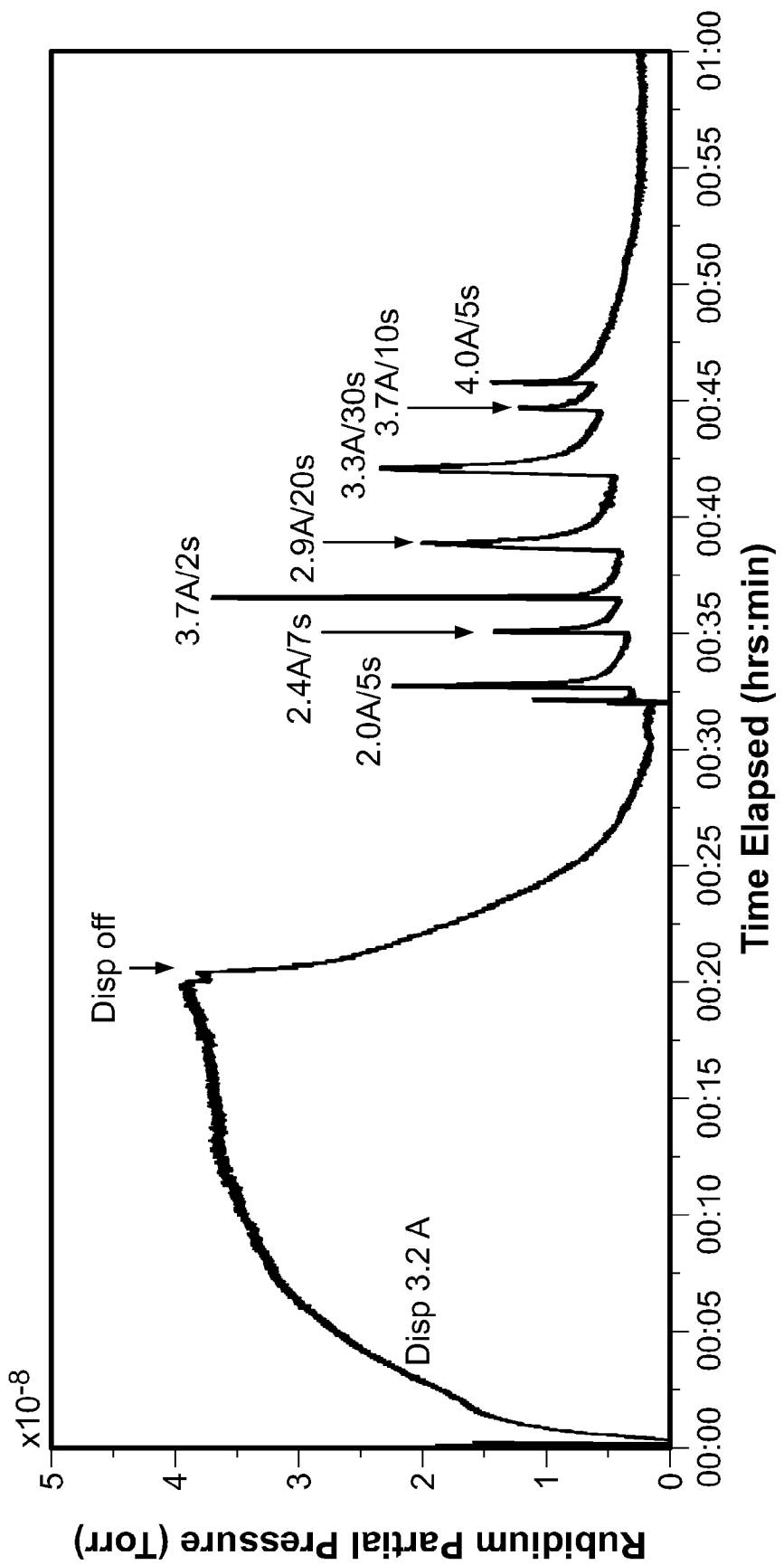
FIG. 6 illustrates a graphical representation of the Rb Partial Pressure over a period of time for varying currents and heating times.

FIG. 6 illustrates a graphical plot of the Rb Partial Pressure vs. Time Elapsed depicting the Rb emission for varying currents and heating times. This graphical plot illustrates the amount of Rb that is released from the receptor on any given shot as a function of the current used to heat the receptor, the time the receptor is heated, and the manner in which the receptor has been used since it was last loaded by the dispenser.

In the embodiments of the present invention, the results are a very pure source of alkali metal for atom systems, such as Bose-Einstein Condensate cold atom systems. When in use, it diminishes the need of additional pumps for removing unwanted contaminants such as gases, product of the alkali atom release reaction from the alkali metal source.

Regarding the alkali metal pump in the present invention, it removes the unwanted background pressure of alkali metal atom in a vacuum cell of a cold atom system. When in use, it facilitates the production of Bose-Einstein Condensates, since it reduces the background pressure of un-trapped alkali metal more rapidly.

The embodiments of the present invention are preferably used in applications such as ultra-cold atom systems for inertial navigation systems with high degree of accuracy that currently do not exist. The government and commercial entities are looking for new systems that operate in GPS (Global Positioning System) denied environments. In addition, the embodiments of the present invention are also used in underwater submarine navigation, underground facilities detection and oil exploration. Furthermore, the present invention is also used in the atomic clock applications.

The embodiments of the present invention discloses the dual-stage alkali dispenser device comprising one alkali metal source, one receptor, and one evaporation coil and one alkali metal pump, however, one skilled in the art can appreciate the dispenser device may comprise of multiple of these elements. Furthermore, the embodiments of the present invention also discloses the alkali metal pump comprising one receptor, and one evaporation coil, however, one skilled in the art can appreciate the dispenser device may comprise of multiple of these elements.

Although not shown, in a preferred embodiment of the present invention, the dual-stage alkali dispenser device comprises one alkali metal source, one evaporation coil and at least two or more receptors. In an example of this embodiment, the first receptor is loaded with alkali metal from an alkali metal source. Next the alkali metal is released from the first receptor by heating the first receptor. A second receptor is loaded with alkali metal from the first receptor. This loading and release of alkali metal can be repeated multiple times between the first and the second receptors. This is a method to recycle the alkali metal inside the vacuum chamber by dispensing alkali metal from one receptor and recapture the excess alkali metal that has not been used in the experiment by an another receptor, and further repeating this process again.

Even though gold is used as an example as the metal in the above embodiments, one skilled in the art would appreciate that other types of metals could be used that would function the same as gold by forming alloy with alkali metals. Additionally, even though Rb is used as an example as the alkali metal in the above embodiments, one skilled in the art would appreciate that other alkali metals in Group I of the periodic table (as defined under the "Definitions" above) and their respective alkali metal compounds could be used and would function the same way as the Rb.

While the present invention has been described with respect to what are some embodiments of the invention, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A dispenser device in a vacuum, comprising:
   at least one alkaline earth metal source; and
   at least one receptor, wherein said receptor is not physically connected to said alkaline earth metal source.

2. The dispenser device of claim 1, wherein said receptor comprises a metal.

3. The dispenser device of claim 2 wherein said metal is coated with gold.

4. The dispenser device of claim 2, wherein said metal comprise nichrome or tungsten.

5. The dispenser device of claim 1 wherein said receptor is a semiconductor.

6. The dispenser device of claim 1, wherein said alkaline earth metal source comprise an alkali metal comprising lithium, sodium, potassium, rubidium or cesium.

7. The dispenser device of claim 1 wherein said alkaline earth metal source comprise an alkali metal compound comprising lithium, sodium, potassium, rubidium or cesium compounds.

8. The dispenser device of claim 1, wherein said alkaline earth metal source comprise an alkaline earth metal comprising barium (Ba), beryllium (Be), calcium (Ca), magnesium (Mg) or strontium (Sr).

9. The dispenser device of claim 1, wherein said alkaline earth metal source comprise an alkaline earth metal compound comprising barium (Ba), beryllium (Be), calcium (Ca), magnesium (Mg) or strontium (Sr).

10. A dispenser device in a vacuum comprising:
    at least one receptor;
    at least one alkaline earth metal source, wherein said receptor is not physically connected to said alkaline earth metal source; and
    at least one metal evaporator.

11. The dispenser device of claim 10, wherein said receptor comprise a metal.

12. The dispenser device of claim 11, wherein said metal comprise nichrome or tungsten.

13. The dispenser device of claim 10 wherein said receptor is a semiconductor.

14. The dispenser device of claim 10 wherein said metal evaporator comprises gold.

15. The dispenser device of claim 14, wherein said gold is evaporated from said metal evaporator in a vacuum.

16. The dispenser device of claim 15 wherein said receptor is coated with the evaporated gold.

17. The dispenser device of claim 10, wherein said alkaline earth metal source comprise an alkali metal comprising lithium, sodium, potassium, rubidium or cesium.

18. The dispenser device of claim 10 wherein said alkaline earth metal source comprise an alkali metal compound comprising lithium, sodium, potassium, rubidium or cesium compounds.

19. The dispenser device of claim 10, wherein said alkaline earth metal source comprise an alkaline earth metal comprising barium (Ba), beryllium (Be), calcium (Ca), magnesium (Mg) or strontium (Sr).

20. The dispenser device of claim 10, wherein said alkaline earth metal source comprise an alkaline earth metal compound comprising barium (Ba), beryllium (Be), calcium (Ca), magnesium (Mg) or strontium (Sr).

21. The device of claim 10 wherein said metal evaporator is not physically connected to said receptor and said alkaline earth metal source.

22. An alkali metal pump device in a vacuum, comprising:
    at least one metal evaporator comprising metal, wherein said metal is evaporated in a vacuum to form an alloy with an alkali metal; and
    an alkaline earth metal source, wherein said alkaline earth metal source not physically connected to said metal evaporator.

23. The pump device of claim 22 wherein said metal is gold.

24. The pump device of claim 22 wherein said alkaline earth metal source is an alkaline earth metal.

25. The pump device of claim 22 further comprising at least one receptor, wherein said receptor is not physically connected to said metal evaporator.

26. The pump device of claim 25, wherein said receptor comprise a metal.

27. The pump device of claim 26, wherein said metal comprise nichrome or tungsten.

28. The pump device of claim 25 wherein said receptor is a semiconductor.

29. The pump device of claim 25, wherein said receptor is an enclosure.

30. The pump device of claim 29, wherein said enclosure comprise walls of a vacuum chamber.

31. A device in a vacuum comprising:
    at least one multi-stage dispenser comprising at least one alkali metal source, at least one receptor and at least one first metal evaporator, said at least one first metal evaporator comprising a metal; and
    at least one alkali metal pump positioned below the at least one multi-stage dispenser, said pump comprising at least one second metal evaporator comprising the metal.

32. The device of claim 31 wherein said at least one multi-stage dispenser is placed in an enclosure having an aperture.

33. The device of claim 31 further comprising a first baffle surrounding the aperture.

34. The device of claim 31 further comprising a second baffle placed between said second metal evaporator and said alkali metal dispenser.

35. The device of claim 31 wherein said metal is gold.

36. The device of claim 31 wherein said alkali metal source comprise an alkali metal comprising lithium, sodium, potassium, rubidium or cesium.

37. The device of claim 31 wherein said alkali metal source comprise an alkali metal compound comprising lithium, sodium, potassium, rubidium or cesium compounds.

38. The dispenser device of claim 31, wherein said alkali metal source comprise an alkaline earth metal comprising barium (Ba), beryllium (Be), calcium (Ca), magnesium (Mg) or strontium (Sr).

39. The dispenser device of claim 31, wherein said alkali metal source comprise an alkaline earth metal compound comprising barium (Ba), beryllium (Be), calcium (Ca), magnesium (Mg) or strontium (Sr).

* * * * *